United States Patent
Lim et al.

(10) Patent No.: US 10,521,153 B2
(45) Date of Patent: Dec. 31, 2019

(54) COMPUTING SYSTEM, NONVOLATILE MEMORY MODULE AND METHOD OF STORAGE DEVICE

(71) Applicant: SAMSUNG ELECTRONICS CO., LTD., Suwon-si, Gyeonggi-do (KR)

(72) Inventors: Sun-Young Lim, Hwaseong-si (KR); Ki-Seok Oh, Seoul (KR); Sungyong Seo, Seongnam-si (KR); Youngjin Cho, Seoul (KR); Insu Choi, Hwaseong-si (KR)

(73) Assignee: SAMSUNG ELECTRONICS CO., LTD., Suwon-si, Gyeonggi-do (KR)

(*) Notice: Subject to any disclaimer, the term of this patent is extended or adjusted under 35 U.S.C. 154(b) by 48 days.

(21) Appl. No.: 15/492,436

(22) Filed: Apr. 20, 2017

(65) Prior Publication Data

US 2017/0308328 A1 Oct. 26, 2017

Related U.S. Application Data

(60) Provisional application No. 62/325,051, filed on Apr. 20, 2016.

(30) Foreign Application Priority Data

May 18, 2016 (KR) .................. 10-2016-0061012

(51) Int. Cl.
*G06F 3/06* (2006.01)
*G11C 11/406* (2006.01)
*G11C 14/00* (2006.01)

(52) U.S. Cl.
CPC ............ *G06F 3/0659* (2013.01); *G06F 3/061* (2013.01); *G06F 3/0647* (2013.01); *G06F 3/0656* (2013.01); *G06F 3/0685* (2013.01); *G11C 11/406* (2013.01); *G11C 14/0018* (2013.01); *G11C 11/40611* (2013.01)

(58) Field of Classification Search
CPC ...... G06F 3/061; G06F 3/0647; G06F 3/0656; G06F 3/0685; G06F 3/0659; G11C 14/0018; G11C 11/406
USPC ................................................ 711/103, 167
See application file for complete search history.

(56) References Cited

U.S. PATENT DOCUMENTS

| | | | |
|---|---|---|---|
| 6,724,675 B2* | 4/2004 | Funyu ................. | G11C 7/1042 365/189.15 |
| 7,679,133 B2 | 3/2010 | Son et al. | |
| 7,782,699 B2* | 8/2010 | Yang ................. | G11C 11/40611 365/201 |
| 8,185,690 B2 | 5/2012 | Miura et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 9,076,511 B2 | 7/2015 | Kim et al. | |
| 9,275,696 B2 | 3/2016 | Solihin | |
| 2003/0097535 A1 | 5/2003 | Hsu et al. | |

(Continued)

*Primary Examiner* — Pierre Miche Bataille
(74) *Attorney, Agent, or Firm* — Lee & Morse, P.C.

(57) ABSTRACT

A method for operating a storage device includes sending a request for a internal operation time for an internal operation to an external device, receiving an internal operation command corresponding to the request from the external device, and performing the internal operation during the internal operation time based on the internal operation command.

20 Claims, 14 Drawing Sheets

(56) References Cited

U.S. PATENT DOCUMENTS

| | | | |
|---|---|---|---|
| 2005/0086525 A1* | 4/2005 | Cirulli | G06Q 10/00 726/4 |
| 2006/0291314 A1* | 12/2006 | Miyamoto | G11C 11/406 365/222 |
| 2011/0158024 A1* | 6/2011 | Kim | G11C 11/406 365/222 |
| 2011/0233648 A1 | 9/2011 | Seol et al. | |
| 2012/0166686 A1 | 6/2012 | Hartung et al. | |
| 2012/0297131 A1 | 11/2012 | Chung et al. | |
| 2012/0317132 A1* | 12/2012 | Brady | G06Q 10/06 707/769 |
| 2014/0064009 A1* | 3/2014 | Lee | G11C 11/40611 365/222 |
| 2014/0071778 A1* | 3/2014 | Coteus | G11C 11/40611 365/222 |
| 2015/0003180 A1* | 1/2015 | Kim | G11C 11/406 365/222 |
| 2015/0006841 A1 | 1/2015 | Chen et al. | |
| 2015/0169443 A1 | 6/2015 | Lee | |
| 2015/0261672 A1 | 9/2015 | Nguyen et al. | |
| 2015/0302928 A1 | 10/2015 | Jung et al. | |
| 2016/0027492 A1 | 1/2016 | Byun et al. | |
| 2016/0086650 A1* | 3/2016 | Kim | G11C 11/406 365/222 |
| 2017/0062063 A1* | 3/2017 | Takeda | G11C 16/26 |

\* cited by examiner

FIG. 10

| | | | | | | | | | | | | | |
|---|---|---|---|---|---|---|---|---|---|---|---|---|---|
| Internal Operation for All Bank [ered] | H | L | H | L | H | V | V | V | V | L | H | L | Renewal TIME |
| Internal Operation for Single Bank [OPB] | H | L | H | L | H | BG | BA | V | V | H | H | L | Renewal TIME |
| RFU | H | L | H | L | H | | | RFU | | L | L | L | RFU |

COMPUTING SYSTEM, NONVOLATILE MEMORY MODULE AND METHOD OF STORAGE DEVICE

CROSS-REFERENCE TO RELATED APPLICATIONS

This application claims benefit under 35 USC § 119 to U.S. Provisional Patent Application No. 62/325,051, filed on Apr. 20, 2016. Korean Patent Application No. 10-2016-0061012, filed on May 18, 2016, and entitled, "Computing System, Nonvolatile Memory Module and Method of Storage Device." Both applications are incorporated by reference herein in their entirety.

BACKGROUND

1. Field

One or more embodiments described herein relate to a computing system, a nonvolatile memory module, and a method for a storage device.

2. Description of the Related Art

Attempts have been made to develop a nonvolatile memory that is compatible with various interfaces of an existing computing system. For example, attempts have been made to use a flash memory as a data storage device or a working memory by mounting the flash memory (or a working memory) on the same slot or channel as a main memory or a working memory of a computer system. However, these attempts have proven to have drawbacks.

SUMMARY

In accordance with one or more embodiments, an operating method of a storage device includes sending a request for a internal operation time for an internal operation to an external device; receiving an internal operation command corresponding to the request from the external device; and performing the internal operation during the internal operation time based on the internal operation command. Requesting the internal operation time may include transferring the request to the external device using a response message of an asynchronous event request command. The request for a internal operation time may include transferring a message including the internal operation time required to perform the internal operation to the external device.

In accordance with one or more other embodiments, a nonvolatile memory module includes at least one volatile memory; at least one nonvolatile memory; and a memory control circuit to control the at least one volatile memory and the at least one nonvolatile memory, wherein the memory control circuit is to transfer an internal operation request message to an external device when an internal operation is to be performed, receive an internal operation command corresponding to the internal operation request message from the external device, and perform during a internal operation time based on the internal operation command, and wherein the internal operation request message includes the internal operation time.

In accordance with one or more other embodiments, a memory module includes a plurality of dynamic random access memories (DRAMs); and a memory control circuit to control the DRAMs based on a command and an address, wherein the memory control circuit is to: transfer a request for a internal operation time for an internal operation to a host, receive internal operation time approval/rejection information corresponding to the request from the host, and perform all or part of the internal operation based on the internal operation time approval/rejection information.

In accordance with one or more other embodiments, a dynamic random access memory includes a memory cell array; and a refresh controller to transfer a message for a request of an internal operation to an external device, receive an internal operation command corresponding to the message, and perform the internal operation during a internal operation time, wherein the internal operation is a refresh operation of the memory cell array and wherein the message includes information about the internal operation time.

In accordance with one or more other embodiments, an apparatus includes a signal line; and a controller to control at least one volatile memory or at least one nonvolatile memory based on signals on the signal line, wherein the controller is to transfer an internal operation request message to an external device when an internal operation is to be performed, receive an internal operation command corresponding to the internal operation request message from the external device, and perform during a internal operation time based on the internal operation command, and wherein the internal operation request message includes the internal operation time.

BRIEF DESCRIPTION OF THE DRAWINGS

Features will become apparent to those of skill in the art by describing in detail exemplary embodiments with reference to the attached drawings in which:

FIG. 10 illustrates an embodiment of an internal operation command.

DETAILED DESCRIPTION

Figure 1:
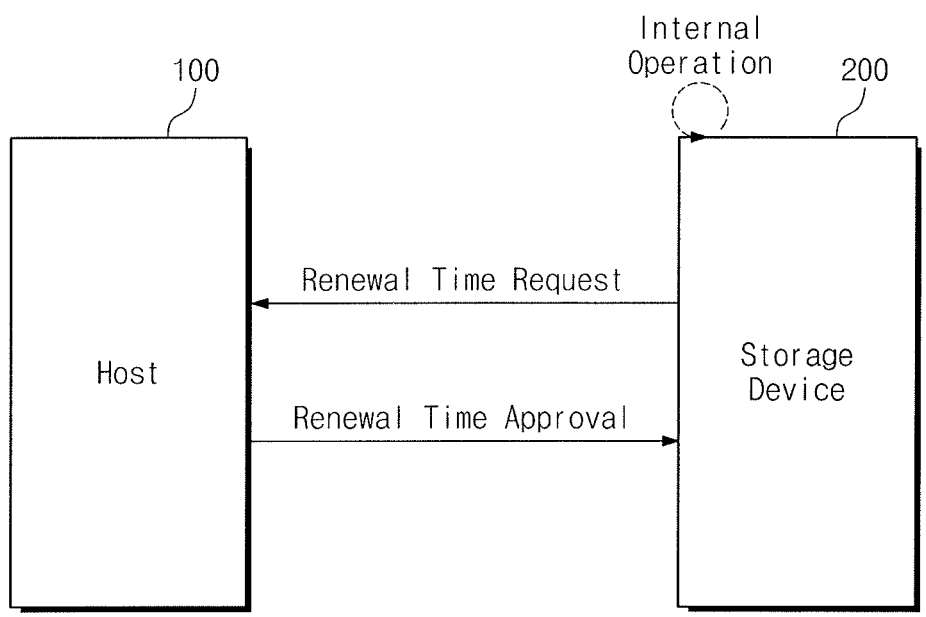
FIG. 1 illustrates an embodiment of a computing system.

FIG. 1 illustrates an embodiment of a computing system 10 which may include a host 100 and a storage device 200. The computing system 10 may be, for example, a computer, a portable computer, an ultra-mobile personal computer (UMPC), a workstation, a data server, a net-book, a personal digital assistant (PDA), a web tablet, a wireless phone, a mobile phone, a smartphone, an e-book, a portable multimedia player (PMP), a digital camera, a digital audio recorder/player, a digital picture/video recorder/player, a portable game machine, a navigation system, a black box, a 3D television, a device capable of transmitting and receiving information at a wireless circumstance, one of various electronics devices constituting a home network, one of various electronics devices constituting computer network, one of various electronics devices constituting telematics network, a radio-frequency identification (RFID), or one of various electronic devices constituting a computing system.

The host 100 may control overall operations of the computing system 10. In an embodiment, the host 100 may include at least one processor, a central processing unit (CPU), a graphics processing unit (GPU), a memory controller, etc. In an embodiment, the processor may include a general-purpose microprocessor, a multi-core processor, a digital signal processor (DSP), an application specific integrated circuit (ASIC), or a combination thereof. In an embodiment, the memory controller may be implemented to control the storage device 200.

In an embodiment, the host 100 may provide the storage device 200 with information indicating the approval or rejection of a internal operation time based on a request of the storage device 200. The internal operation time may be a time to perform an internal operation of the storage device 200.

In an embodiment, the internal operation time approval/rejection information may be transferred or determined based on the type of command or data. In another embodiment, the internal operation time approval/rejection information may be transmitted through a separate line between the host 100 and the storage device 200.

In FIG. 1, an embodiment is illustrated wherein the host 100 transfers a internal operation time to the storage device 200 based on a request of the storage device 200. In another embodiment, the host device 100 may transfer the internal operation time approval/rejection information to the storage device 200 based on an internal policy without a request of the storage device 200.

The storage device 200 may be connected to the host 100 to store data for an operation of the host 100. The storage device 200 may be at least one of a volatile memory, a nonvolatile memory, or a combination thereof. For example, the storage device 200 may be a dual in-line memory module (DIMM), a nonvolatile dual in-line memory module (NVDIMM), a solid state drive (SSD), universal flash storage (UFS), an embedded multimedia card (eMMC), a secure digital (SD) card, a dynamic random access memory (DRAM), a static RAM (SRAM), a NAND flash memory, a vertical NAND flash memory, a phase change RAM (PRAM), or a resistive RAM (RRAM).

In an embodiment, the storage device 200 may be connected to the host 100 based on the double data rate (DDR) interface standard. For example, the storage device 200 may be implemented with any one of DDRx series (x being an integer). The storage device 200 may be connected to the host 100 through various kinds of communication interfaces except the DDR interface. For example, the communication interface may comply with the following communication standard: non-volatile memory express (NVMe), peripheral component interconnect express (PCIe), serial AT attachment (SATA), small computer system interface (SCSI), serial attached SCSI (SAS), universal storage bus (USB) attached SCSI (UAS), internet small computer system interface (iSCSI), fiber channel, or fiber channel over Ethernet (FCoE).

In an embodiment, the storage device 200 may request a internal operation time for an internal operation from the host 100 when it is determined that the internal operation is to be performed according to an internal policy. In an embodiment, a internal operation time request may be transferred to the host 100 in the type of a message.

In an embodiment, a message having the internal operation time request may be transmitted to the host 100 through at least one data channel, at least one clock channel, at least one control channel, at least one dedicated message channel between the host 100 and the storage device 200, or a combination thereof. For example, when the internal operation time request is transmitted through the data channels, it may be included in a response message corresponding to an asynchronous command. The asynchronous command may include an asynchronous event request command. Asynchronous events may be used to inform software or a controller of the host 100 of status, error, and health information of the storage device 200.

The above-described internal operation time request may be transferred in the type of a message. In another embodiment, the internal operation time request may be provided to the host 100 in the type of a signal for requesting selection of a register corresponding to the internal operation time for the internal operation.

In an embodiment, the storage device 200 may be implemented to perform the internal operation after receiving the internal operation time approval/rejection information of the host 100. The internal operation may include various operations associated with, for example, refresh, timing calibration, process-voltage-temperature (PVT) compensation, transmission of internal data, or another operation. In an embodiment, all or part of the internal operation may be performed according to the internal operation time approval/rejection information. To this end, the internal operation time approval/rejection information may further include information about execution of all or part of the internal operation.

In the computing system 10 according to an embodiment, the storage device 200 may directly request the internal operation time for the internal operation of the storage device 200 from the host 100. The host 100 may transfer authority on a time to the storage device 200 during the internal operation time based on the request. Accordingly, it may be possible for the storage device 200 to perform the internal operation sufficiently. For example, the host 100 may approve the internal operation time for the internal operation with respect to the storage device 200.

Figure 2:
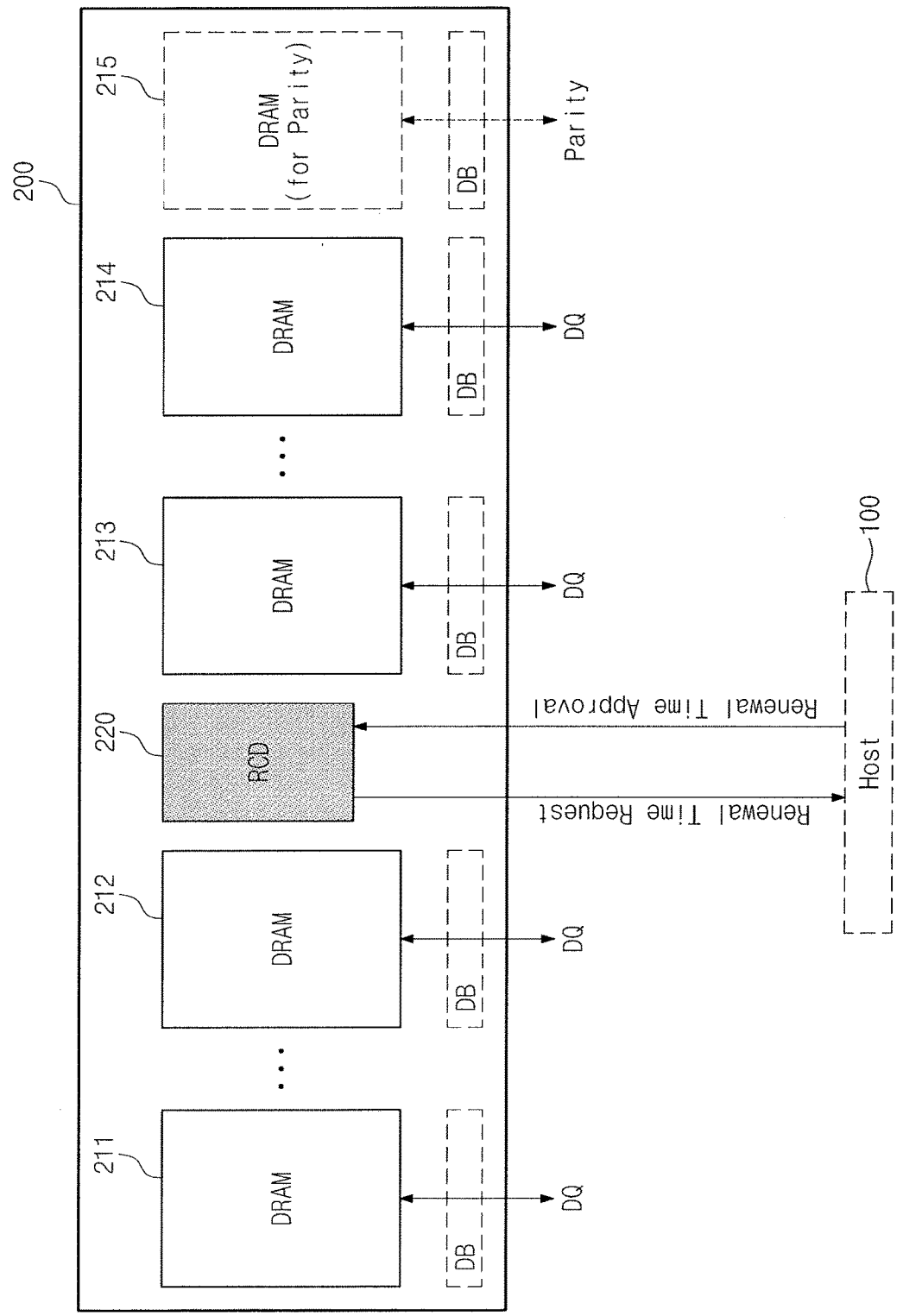
FIG. 2 illustrates an embodiment of a storage device.

FIG. 2 illustrates an embodiment of the storage device 200 implemented with a memory module. Referring to FIG. 2, the storage device 200 may include a plurality of DRAMs 211 to 214 and a memory module controller (RCD) 220. Each of the DRAMs 211 to 214 may input and output data DQ under control of the memory module controller 220. The number of DRAMs 211 to 214 in FIG. 2 is 4, but may be a different number in another embodiment.

The memory module controller 220 may receive a command and/or an address from the host 100 and control input/output operations of the DRAMs 211 to 214. In an embodiment, the memory module controller 220 may send a internal operation time request for an internal operation to the host 100 based on the internal policy. In an embodiment, the memory module controller 220 may perform the internal operation based on the internal operation time approval/rejection information transmitted from the host 100.

In an embodiment, the storage device 200 may further include a DRAM 215 for parity. In an embodiment, the storage device 200 may further include data buffers DBs to buffer the data DQ between the host 100 and the DRAMs 211 to 214. In an embodiment, the storage device 200 may be implemented to satisfy a DDRx SDRAM specification. For example, the storage device 200 may be implemented to satisfy a next-generation DDR4 SDRAM specification. The internal operation time may be implemented, for example, in a register set way.

Figure 3:
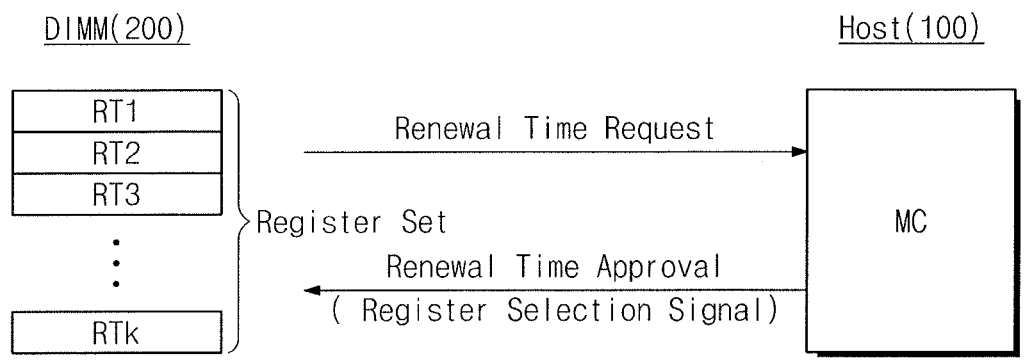
FIG. 3 illustrates an embodiment of a internal operation time request and a response of the computing system.

FIG. 3 illustrates an embodiment of a internal operation time request and a response in the computing system 10 based on the register set way. Referring to FIG. 3, the storage device 200 may include a register set that stores a plurality of internal operation times RT1 to RTk (k being a natural number of 2 or more). For example, a first internal operation time RT1 may be a time corresponding to 16 clocks and a second internal operation time RT2 may be a time corresponding to 8 clocks.

The memory controller of the host 100 may send a register selection signal to the storage device 200 based on the internal operation time request of the storage device 200. The register selection signal may be a signal for selecting a register, which corresponds to the internal operation time request, from among registers of the register set. For example, the register selection signal may include the internal operation time approval/rejection information. In an embodiment, the register set may be in the memory module controller 220 in FIG. 2 or in a different location.

The computing system 10 in FIGS. 1 to 3 describes an embodiment in terms of the internal operation time. In another embodiment, the computing system 10 may be described in the context of issuing an internal operation request and an internal operation command responding to the internal operation request.

Figure 4:
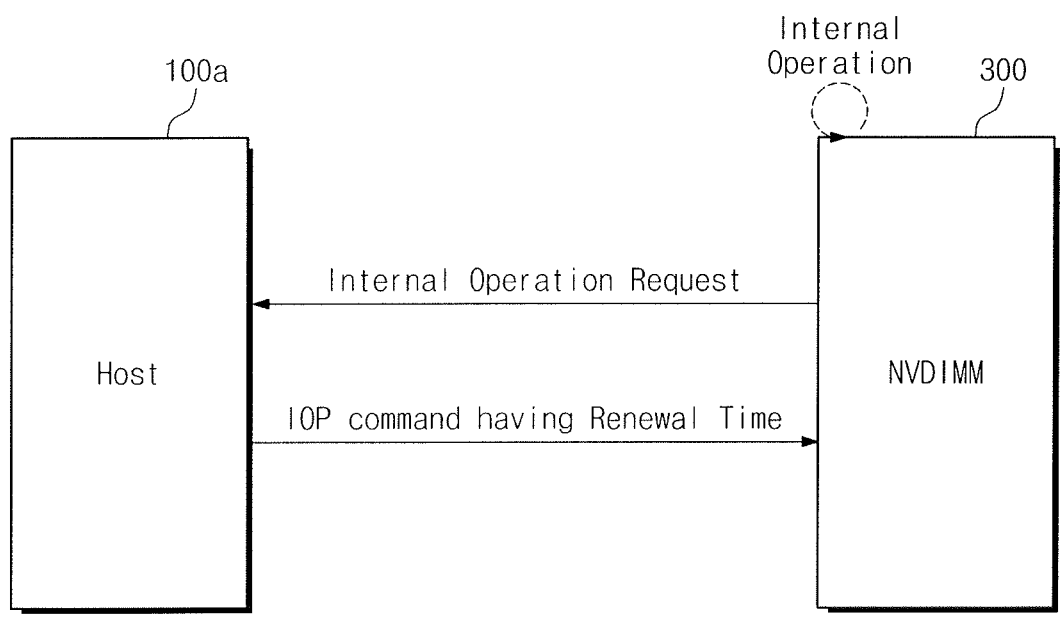
FIG. 4 illustrates another embodiment of a computing system.

FIG. 4 illustrates another embodiment of a computing system 20 which may include a host 100a and a nonvolatile memory module (NVDIMM) 300. The host 100a may receive the internal operation request from the nonvolatile memory module 300, issue an internal operation command IOP based on the internal operation request, and send the issued internal operation command IOP to the nonvolatile memory module 300. The internal operation command IOP may include the internal operation time for the internal operation. In an embodiment, the internal operation command 10P may further include information corresponding to the approval or rejection of the internal operation request.

In an embodiment, the internal operation request may be transmitted to the host 100a, for example, through data pins, data strobe pins, address/command pins; control signal pins, message-dedicated pins, or a combination thereof. In an embodiment, the internal operation command IOP may be generated by the command/address pins, reserved future use (RFU) pins, or a combination thereof.

The nonvolatile memory module 300 may send the internal operation request to the host 100a when the internal operation is to be performed according to internal policy. The internal operation request may be implemented, for example, in the type of a message/signal. For example, the internal operation request, which is transferred in the type of a message/signal, may include the internal operation time for the internal operation.

In an embodiment, the nonvolatile memory module 300 may be connected to the host 100a through the DDRx interface (x being a natural number). For example, the nonvolatile memory module 300 may be implemented to satisfy a next-generation DDR4 SDRAM specification.

In an embodiment, the nonvolatile memory module 300 may be implemented with a nonvolatile dual in-line memory module (NVDIMM) complying, for example, with the JEDEC standard. The NVDIMM may be a memory module that retains data even at unexpected power loss or system fault, or even though electric power is interrupted while a system ends normally. The NVDIMM may be used to improve performance of application, a time to recover a fault of a data security system, and the durability and reliability of the SSD.

The NVDIMM may have various forms. One embodiment of the NVDIMM is a byte-addressable memory-mapped device that accesses at a memory speed or near memory speed. The NVDIMM, which supports the DDR4 SDRAM, may be commercially used by any one of a variety of hardware suppliers. Another embodiment of the NVDIMM is a flash device module resident on an interconnect channel. Such an NVDIMM may be accessed, for example, through a driver block of a host. A flash device may be accessed when a front-end cache miss occurs. Another embodiment of the NVDIMM is a module that has all virtues of fast accessible DRAMs and a high-capacity nonvolatile memory.

The nonvolatile memory module 300 may include a message channel through which an internal operation request message is transmitted to the host 100a. In an embodiment, a DQ channel, a DQS channel, a clock channel, a control signal channel, or a combination thereof may be used as the message channel. In another embodiment, the message channel may have a dedicated channel for a transfer of the internal operation request message.

In an embodiment, the internal operation request message may include requesting a internal operation time from the nonvolatile memory module 300, which will perform the internal operation, so that the host 100a does not send a new command to the nonvolatile memory module 300 for a predetermined time. In another embodiment, even though the host 100a issues a new command for a predetermined time, the nonvolatile memory module 300, which receives an internal operation command, may ignore the new command.

In an embodiment, the internal operation time may vary, for example, based on the kind of an internal operation that the nonvolatile memory module 300 performs. For example, the internal operation time for a refresh operation may be about several microseconds. The internal operation time for an internal data transmission operation may be, for example, about several hundred microseconds.

In an embodiment, the host 100a may approve or reject the internal operation request when receiving the internal operation request. For example, if the host 100a approves the internal operation request, the host 100a may issue an internal operation command IOP corresponding to the internal operation request and send it to the nonvolatile memory module 300. For example, if the host 100a rejects the internal operation request, the nonvolatile memory module 300 may postpone the internal operation. In an embodiment, the nonvolatile memory module 300 may perform the internal operation during the internal operation time without an interrupt instruction of host 100a.

Figure 5:
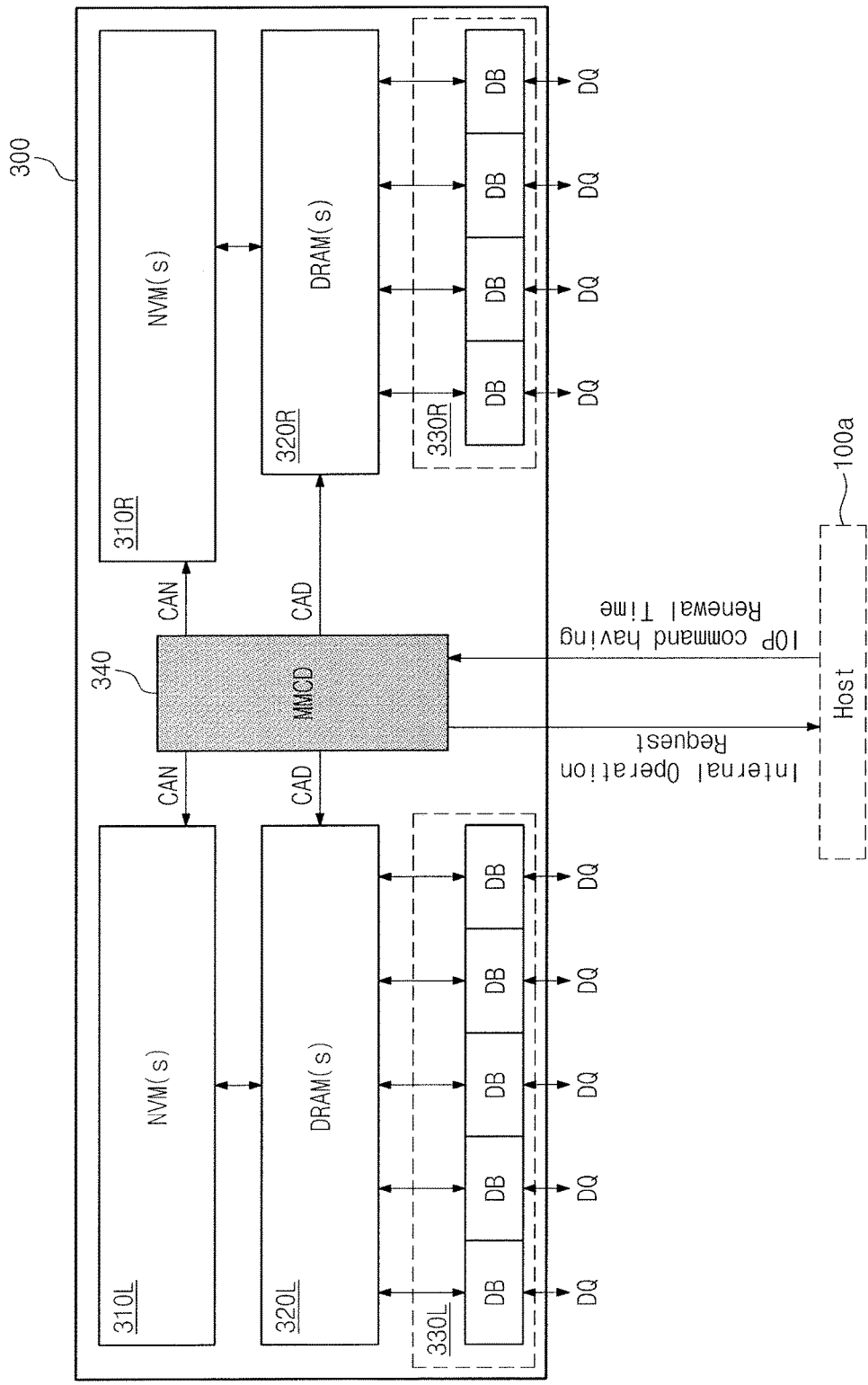
FIG. 5 illustrates an embodiment of a nonvolatile memory module.

FIG. 5 illustrates another embodiment of a nonvolatile memory module 300 which may include first and second nonvolatile memories 310L and 310R, first and second volatile memories 320L and 320R, first and second data buffers 330L and 330, and a memory control circuit (MMCD) 330.

Each of the first and second nonvolatile memories 310L and 310R may include at least one nonvolatile memory. In an embodiment, the at least one nonvolatile memory may be a NAND flash memory, a vertical NAND flash memory (VNAND), a NOR flash memory, a resistive random access memory (RRAM), a phase change memory (PRAM), a magneto-resistive random access memory (MRAM), a ferroelectric random access memory (FRAM), a spin transfer torque random access memory (STT-RAM), or a thyristor RAM (TRAM).

Furthermore, the nonvolatile memory may be implemented to have a three-dimensional array structure. In an embodiment, a three-dimensional 3D memory array is provided. The 3D memory array may be monolithically formed in one or more physical levels of arrays of memory cells having an active area above a silicon substrate and circuitry associated with the operation of those memory cells, whether the associated circuitry is above or within the substrate. The associated circuitry is above or within such substrate. The term "monolithic" may correspond to layers of each level of the array being directly deposited on the layers of each underlying level of the array.

In an embodiment, the 3D memory array includes vertical NAND strings that are vertically oriented such that at least one memory cell is located over another memory cell. The at least one memory cell may comprise a charge trap layer. Each vertical NAND string may include at least one select transistor over memory cells. At least one selection transistor may have the same structure as memory cells and be monolithically formed together with memory cells.

The three-dimensional memory array includes a plurality of levels and has word lines or bit lines shared among levels. The following documents are hereby incorporated by reference in relation to example configurations for three-dimensional memory arrays which include a plurality of levels, which is applied by Samsung Electronics Co., with word lines and/or bit lines shared between levels: U.S. Pat. Nos. 7,679,133, 8,553,466, 8,654,587, and 8,559,235 and U.S. Patent Publication. No. 2011/0233648. The nonvolatile memory may be applicable to a charge trap flash (CTF) in which an insulating layer is used as a charge storage layer, as well as a flash memory device in which a conductive floating gate is used as a charge storage layer.

Each of the first and second volatile memories 320L and 320R may include at least one DRAM. In an embodiment, the at least one DRAM may be implemented with a dual-port DRAM. For example, first ports of the at least one DRAM may be connected to at least one of the first and second nonvolatile memories 310L and 310R, and second ports thereof may be connected to a corresponding one of the first and second data buffers 330L and 330R.

The memory control circuit 340 may be implemented to receive a command or an address from the host 100a and generate a first command/address CAN for controlling the first and second nonvolatile memories 310L and 310R or a second command/address CAD for controlling the first and second volatile memories 320L and 320R.

In an embodiment, the memory control circuit 340 may issue an internal operation request for an internal operation and send it to the host 100a. In an embodiment, the memory control circuit 340 may receive the internal operation command IOP from the host 100a and perform the internal operation based on the received internal operation command IOP. The internal operation command IOP may include the internal operation time for the internal operation.

The nonvolatile memory module 300 in FIG. 5 may include at least a first nonvolatile memory 310L, at least a first volatile memory 320L, and first data buffers 330L, which are arranged on a left side with respect to the memory control circuit 340, and at least a second nonvolatile memory 310R, at least a second volatile memory 320R, and second data buffers 330R, which are arranged on a right side with respect to the memory control circuit 340. The nonvolatile memory module 300 may have a different arrangement of memories, memory control circuits, buffers, etc., in another embodiment.

Figure 6:
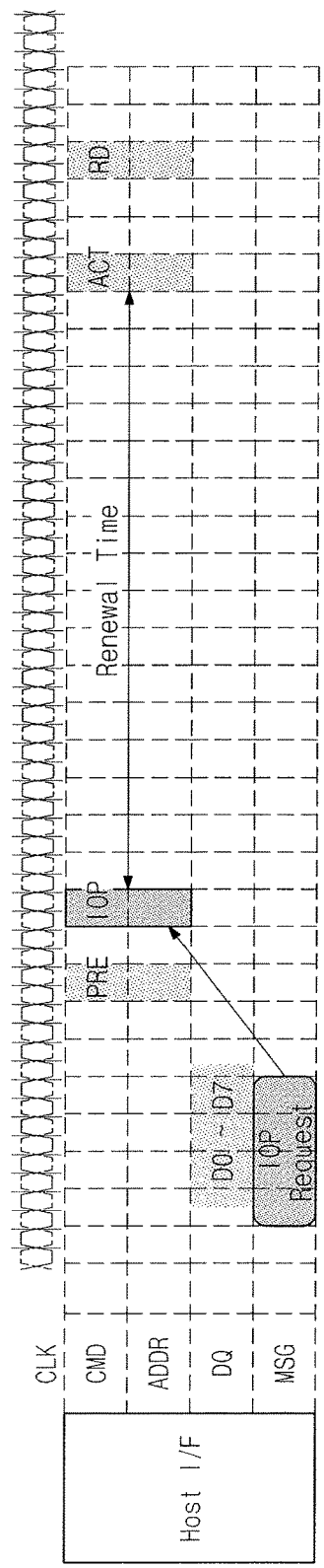
FIG. 6 illustrates an embodiment of host interface timing.

FIG. 6 illustrates an embodiment of the timing of a host interface corresponding to the internal operation request of the nonvolatile memory module 300. In this embodiment, the internal operation request IOP may be transferred to the host 100a through a host interface between the host 100a and the nonvolatile memory module 300. The host interface may be, for example, a memory internal channel. In an embodiment, the internal operation request may include a internal operation time to complete the internal operation or information about the internal operation time.

When a message including the internal operation request is transferred to the host 100a through a message pin MSG, information corresponding to the internal operation time may be also sent to the host 100a. The information corresponding to the internal operation time may be transmitted through data pins DQ0 to DQ7. In one embodiment, the information corresponding to the internal operation time may be transmitted through command/address pins CAs such as a CKE pin, a CS pin, a CK pin, or an ODT pin.

The information relating to the internal operation time may be selectively transmitted to the host 100a through toggling of the message pin MSG. In an embodiment, a continuous toggling frequency of the message pin MSG may indicate the internal operation time. For example, a continuous toggling frequency of the message pin MSG may be a time for the internal operation.

In one embodiment, the internal operation request in the message may be an internal operation request for all or some banks. If the internal operation request for all banks is approved by the host 100a, the nonvolatile memory module 300 may perform the internal operation with respect to all banks while the host 100a fails to access the nonvolatile memory module 300. If the internal operation request for some of the banks is approved by the host 100a, the internal operation may be performed with respect to only a bank, which is selected through the internal operation request, from among some of the banks. In this case, the remaining banks other than the selected bank may be accessed for a read/write operation.

In an embodiment, if receiving the internal operation request and the information corresponding to the internal operation time, the host 100a may determine whether approve or reject the internal operation request.

If the internal operation request is approved, the host 100a may issue the internal operation command IOP such that the nonvolatile memory module 300 starts the internal operation. Afterwards, the host 100a may not issue a new command for accessing the nonvolatile memory module 300 during the internal operation time.

If the internal operation request is rejected, the host 100a may ignore the internal operation request by not performing one internal operation command and issue a command notifying to reject the internal operation request. The nonvolatile memory module 300 may recognize the rejection notification of the host 100a and postpone or abandon the execution of the internal operation. In one embodiment, the internal operation time approval/rejection information may not be in the internal operation request of the nonvolatile memory module 300.

Figure 7:
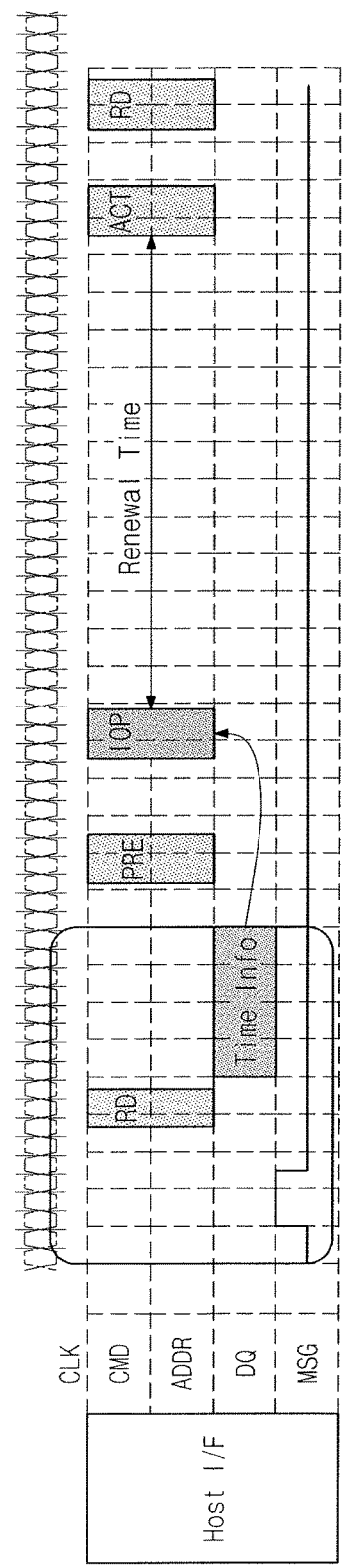
FIG. 7 illustrates another embodiment of host interface timing.

FIG. 7 illustrates another embodiment of timing of the host interface for the internal operation request of the nonvolatile memory module 300. In this embodiment, the internal operation request may be provided in a two-operation procedure.

In a first operation, the nonvolatile memory module 300 may send a signal for requesting the internal operation only to the host 100a through the message channel MSG, and store internal operation time-associated information (time information) in a buffer area of the nonvolatile memory module 300.

In a second operation, the host 100a may read the buffer area to issue a read command for extracting the internal operation time for the internal operation. In an embodiment, the host 100a may issue the internal operation command IOP based on read time information. Afterwards, the nonvolatile memory module 300 may perform the internal operation during the internal operation time based on the internal operation command IOP.

Also, in the second operation, the host 100a issues a read command for extracting the internal operation time of the buffer area. In another embodiment, the nonvolatile memory module 300 may read internal operation time approval/rejection information stored in the buffer area based on the internal operation command IOP of the host 100a and perform the internal operation for the read internal operation time.

Figure 8:
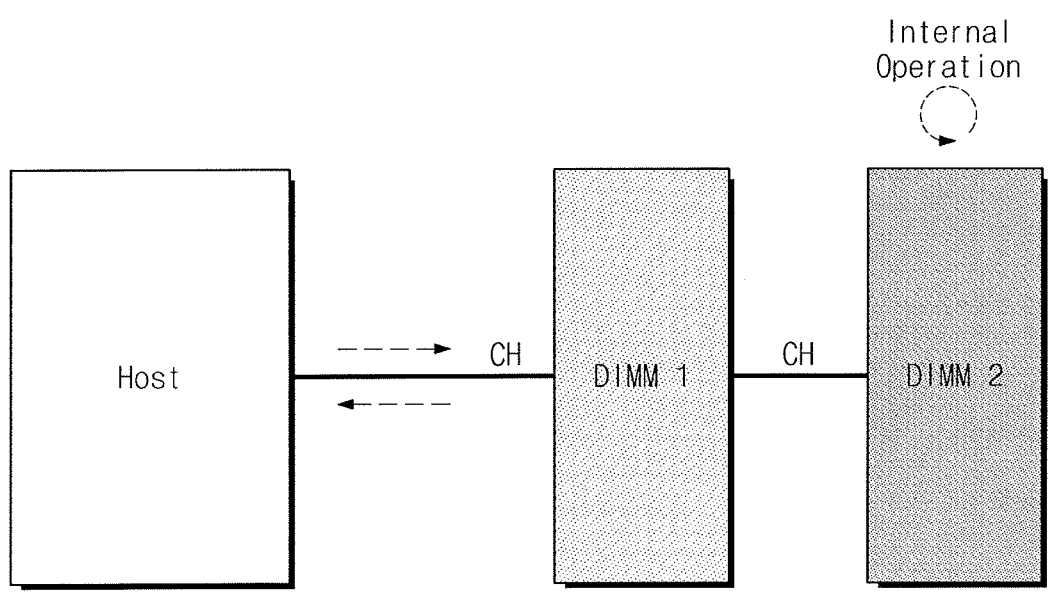
FIG. 8 illustrates another embodiment of a computing system.

FIG. 8 illustrates another embodiment of a computing system including two memory modules connected to one memory channel. Referring to FIG. 8, a host may be connected to first and second memory modules DIMM1 and DIMM2 through one memory channel CH. Each of the first and second memory modules DIMM1 and DIMM2 may perform the internal operation. For descriptive convenience, below, it is assumed that the second memory module DIMM2 performs the internal operation.

Figure 9:
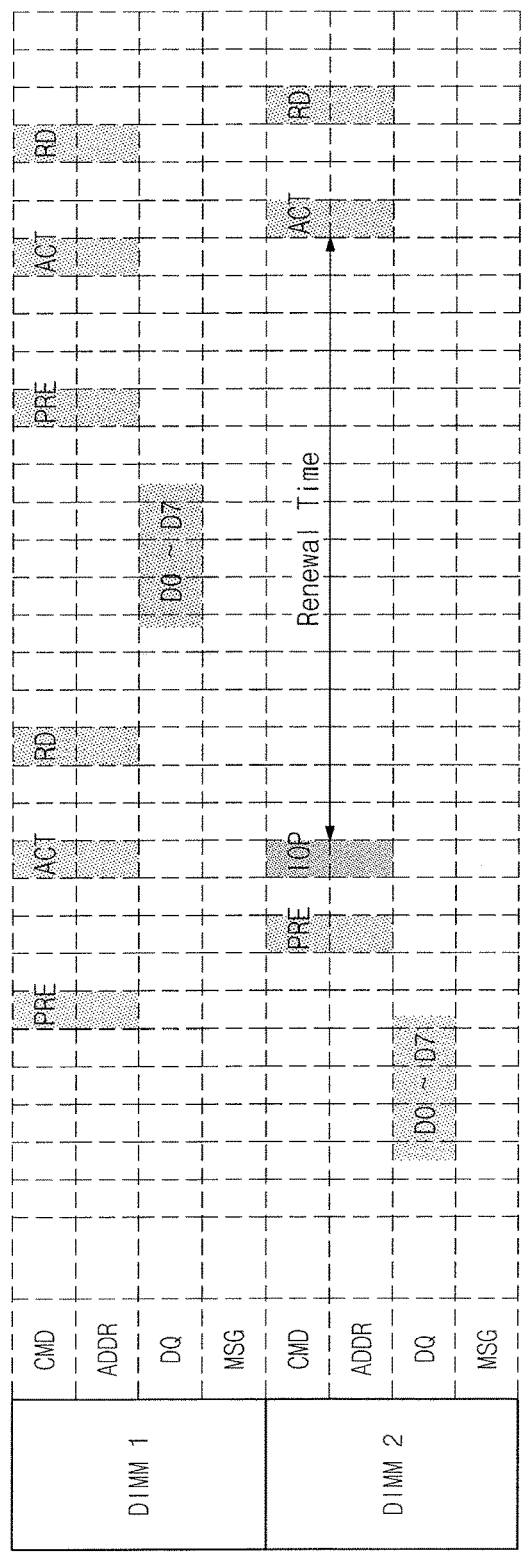
FIG. 9 illustrates an embodiment of timing for multiple memory modules.

FIG. 9 illustrates an embodiment of timing of the first and second memory modules DIMM1 and DIMM2 when the second memory module DIMM2 of the computing system in FIG. 8 performs the internal operation.

Referring to FIGS. 8 and 9, the second memory module DIMM2 may perform the internal operation during the internal operation time based on the internal operation command IOP. The internal operation may be a data transmission operation performed in the second memory module DIMM2. A host may prohibit access to the second memory module DIMM2 while the internal operation is performed. Even though the host does not access the second memory module DIMM2, it may access the first memory module DIMM1 of an idle state. For example, in FIG. 9, the first memory module DIMM1 may sequentially receive a precharge command PRE, an active command ACT, and a read command/address RD and output data D0 to D7 corresponding to the read command/address RD. Afterwards, the first memory module DIMM1 may continue to perform a next read operation.

The computing system may hide the internal operation of the second memory module DIMM2 after data communication between the host and the first memory module DIMM1. Since the internal operation of the second memory module DIMM2 is hidden, performance of system may be improved.

FIG. 10 illustrates an embodiment of an internal operation command issued by a host of a computing system. Referring to FIG. 10, the host may issue internal operation commands IOPA and IOPB, when approving the internal operation, based on the internal operation request of the memory module DIMM/the nonvolatile memory module NVDIMM. The internal operation command IOPA may instruct the internal operation for all banks of the memory module DIMM/the nonvolatile memory module NVDIMM. The second internal operation command IOPB may instruct the internal operation for a single bank of the memory module DIMM/the nonvolatile memory module NVDIMM.

In an embodiment, an all-bank internal operation and a single-bank internal operation may be distinguished using an address pin as in FIG. 10. In an embodiment, the internal operation commands IOPA and IOPB may be generated from a specific combination of command/address pins. Such combinations may be reserved for the reserved future use (RFU) of a typical DDR4 SDRAM. In an embodiment, command/address pins associated with the internal operation commands IOPA and IOPB may include CKE, CS, CAS, RAS, ACT, bank address, and address pins.

In an embodiment, the internal operation commands IOPA and IOPB may include a internal operation time that varies according to a programmed value applied to the address pins. For example, the programmed value may be programmed to correspond to address pins A0 to A9.

In FIGS. 8 and 9, one computing system connects two memory modules DIMM1 and DIMM2, which may be the same as each other, to one memory channel. In another embodiment, the computing system may connect the memory module DIMM and the nonvolatile memory module NVDIMM to one memory channel.

Figure 11:
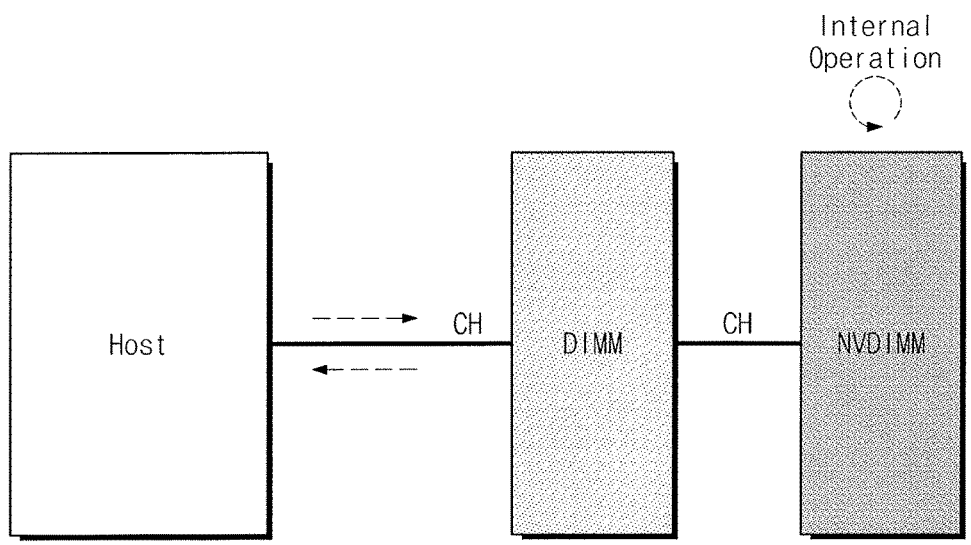
FIG. 11 illustrates another embodiment of a computing system.

FIG. 11 illustrates an embodiment of a server system. Referring to FIG. 11, the computing system may connect the memory module DIMM and the nonvolatile memory module NVDIMM to one memory channel. The host may access the memory module DIMM while the above-described internal operation is performed on the nonvolatile memory module NVDIMM, and vice versa. For example, the host may access the nonvolatile memory module NVDIMM while the above-described internal operation is performed on the memory module DIMM.

In the computing system in FIG. 11, the memory module DIMM and the nonvolatile memory module NVDIMM are connected to one memory channel. In one embodiment, the computing system includes the memory module DIMM and the nonvolatile memory module NVDIMM respectively connected to two memory channels.

Figure 12:
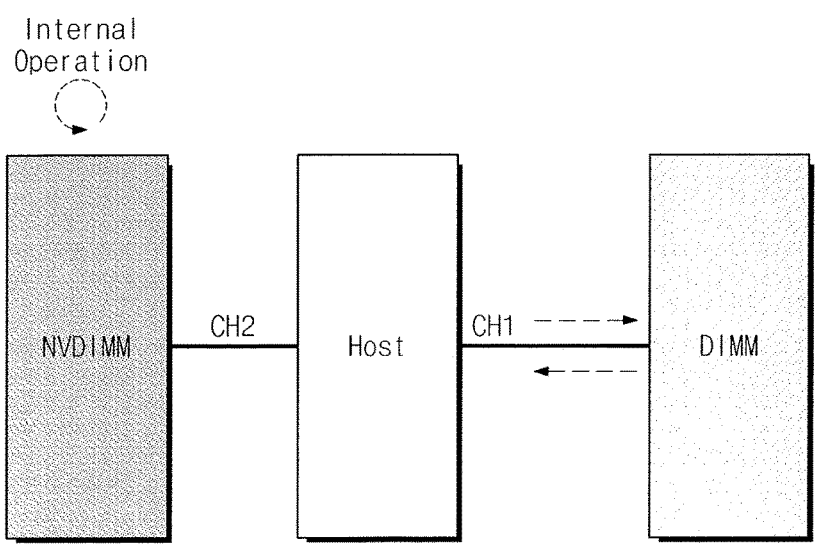
FIG. 12 illustrates another embodiment of a computing system.

FIG. 12 illustrates another embodiment of a computing system. Referring to FIG. 12, the host may be connected with the memory module DIMM through a first channel CH1 and with the nonvolatile memory module NVDIMM through a second channel CH2. The host may access the memory module DIMM while the above-described internal operation is performed on the nonvolatile memory module NVDIMM. This embodiment may be applicable, for example, to a DRAM implemented in chip form instead of a memory module form.

Figure 13:
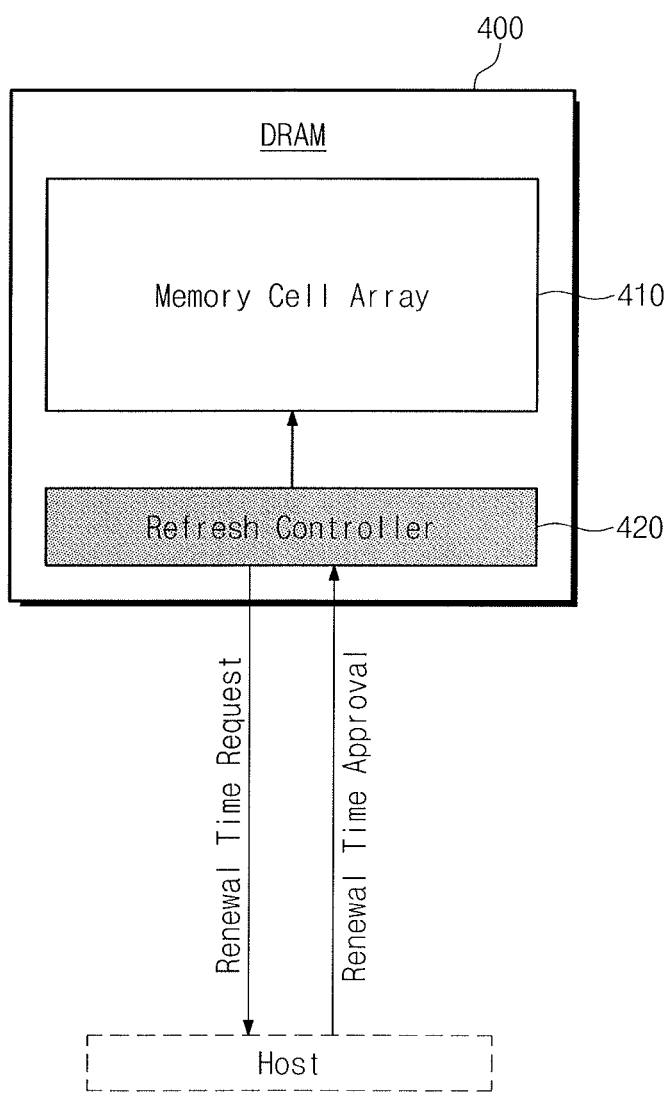
FIG. 13 illustrates an embodiment of a dynamic random access memory.

FIG. 13 illustrates an embodiment of a DRAM 400 which may include a memory cell array 410 and a refresh controller 420. The memory cell array 410 may include a plurality of DRAM cells respectively arranged at intersections of word lines and bit lines. The refresh controller 420 may perform a refresh operation of the DRAM cells. In an embodiment, the refresh controller 420 may perform the refresh operation based on a refresh command of the host or external device.

In an embodiment, the refresh controller 420 may request a internal operation time from the host/external device when an internal operation is to be performed. The host/external device may send internal operation time approval/rejection information to the refresh controller 420 based on the internal operation time request. The refresh controller 420 may receive the internal operation time approval/rejection information to perform the refresh operation during the internal operation time. In an embodiment, the refresh controller 420 may perform the refresh operation with respect to all or some banks. This embodiment may be applicable, for example, to a 3D Xpoint memory in which electric resistance is used as a bit.

Figure 14:
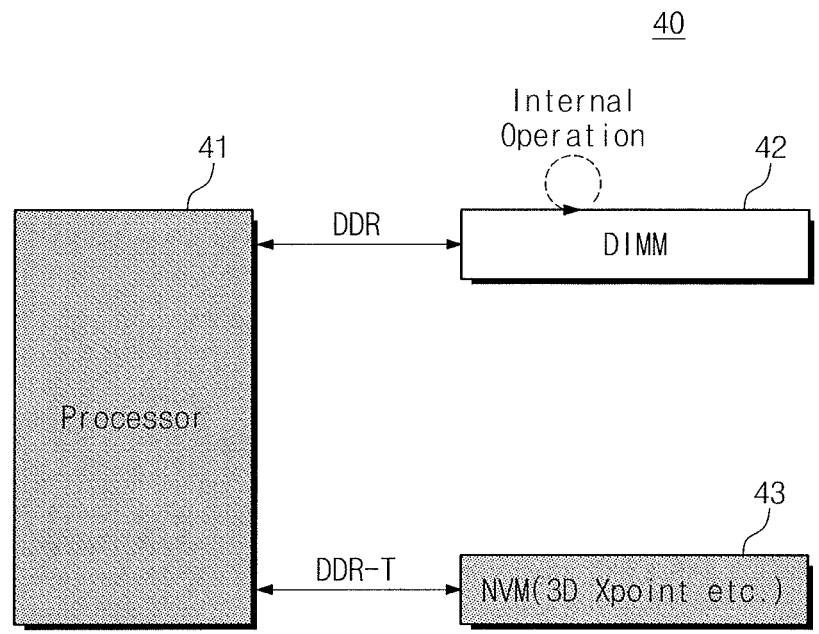
FIG. 14 illustrates another embodiment of a computing system.

FIG. 14 illustrates an embodiment of a computing system 40 which may include a processor 41, a memory module (DIMM) 42, and a nonvolatile memory (NVM) 43. The processor 41 may control the memory module 42 and the nonvolatile memory 43. In an embodiment, the processor 41 may issue an internal operation command based on an internal operation request of the memory module 42.

The memory module 42 may be connected to the processor 41 through the DDR interface. The memory module 42 may send the internal operation request to the processor 41 when the internal operation is to be performed. Also, the memory module 42 may be implemented to perform the internal operation based on an internal operation command from the processor 41.

The nonvolatile memory 43 may be connected to the processor 41 through the DDR-T (transaction) interface. In this case, the memory module 42 may perform a cache function of the nonvolatile memory 43. In an embodiment, the nonvolatile memory 43 may be a 3D-Xpoint memory. This embodiment is applicable, for example, to the internal operation of the nonvolatile memory 43.

Figure 15:
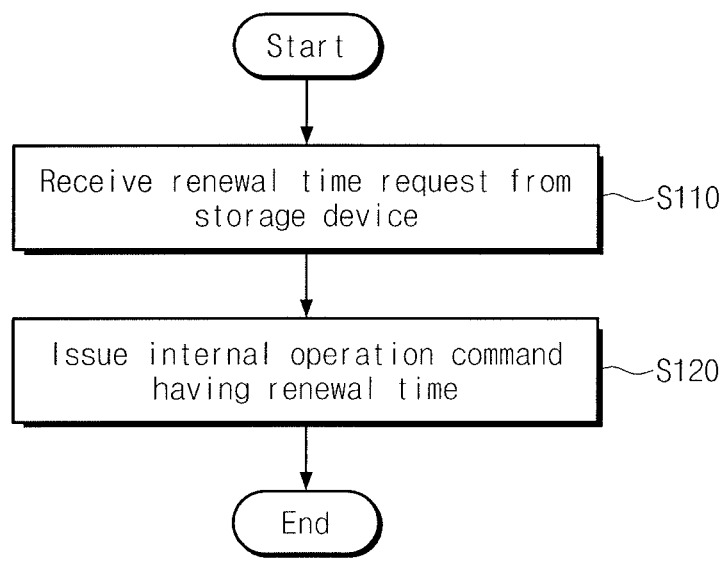
FIG. 15 illustrates an embodiment of an operating method for a host.

FIG. 15 illustrates an embodiment of a method for operating a host. In this method, the host may receive the internal operation time request for performing the internal operation from various kinds of storage devices (DIMM, NVDIMM, DRAM, NVM, SSD, eMMC, SD card, UFS, etc.) connected to a memory channel (S110). The host may approve or reject the internal operation (e.g., a store operation) based on the internal operation time request. The host may issue an internal operation command corresponding to the internal operation time request. The issued internal operation command may include a internal operation time (S120). The issued internal operation command may be transferred to a storage device, and the storage device may perform the internal operation during the internal operation time based on the internal operation command.

Figure 16:
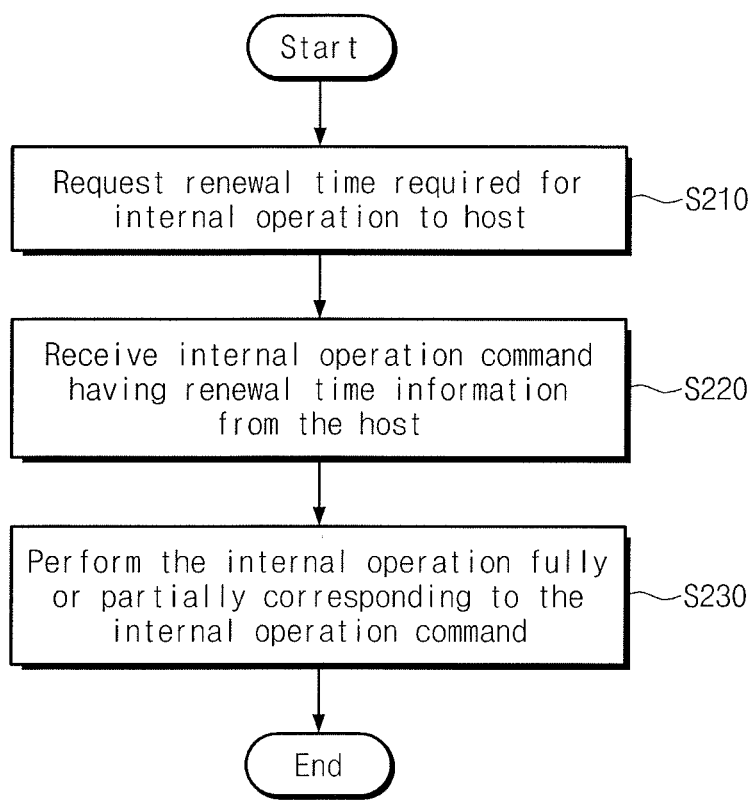
FIG. 16 illustrates an embodiment of an internal operating method for a storage device.

FIG. 16 illustrates an embodiment of a method for operating a storage device. Referring to FIGS. 15 to 16, in this method, the storage device may determine whether the internal operation is to be performed according to an internal policy and may send the internal operation time request for the internal operation to the host (S210). The internal operation time request may be transferred to the host in various forms, e.g., message form or signal form. For example, the storage device may be implemented to send a message, which includes the internal operation time request, to the host.

Afterwards, the storage device may receive the internal operation command, which includes information indicating the approval or rejection of the internal operation time, from the host (S220). The storage device may perform all or a part of the internal operation based on the internal operation command (S230).

In an embodiment, when the internal operation command includes information indicating the approval of the internal operation time, the storage device may ignore a new command issued by the host while performing the internal operation. In an embodiment, when the internal operation command includes information indicating the rejection of the internal operation time, the storage device may receive or process a new command issued by the host. The storage device may receive and buffer a new command issued by the host while performing the internal operation. The storage device may first process a new command from the host after holding the internal operation based on the new command. This embodiment may be applicable, for example, to a data server.

Figure 17:
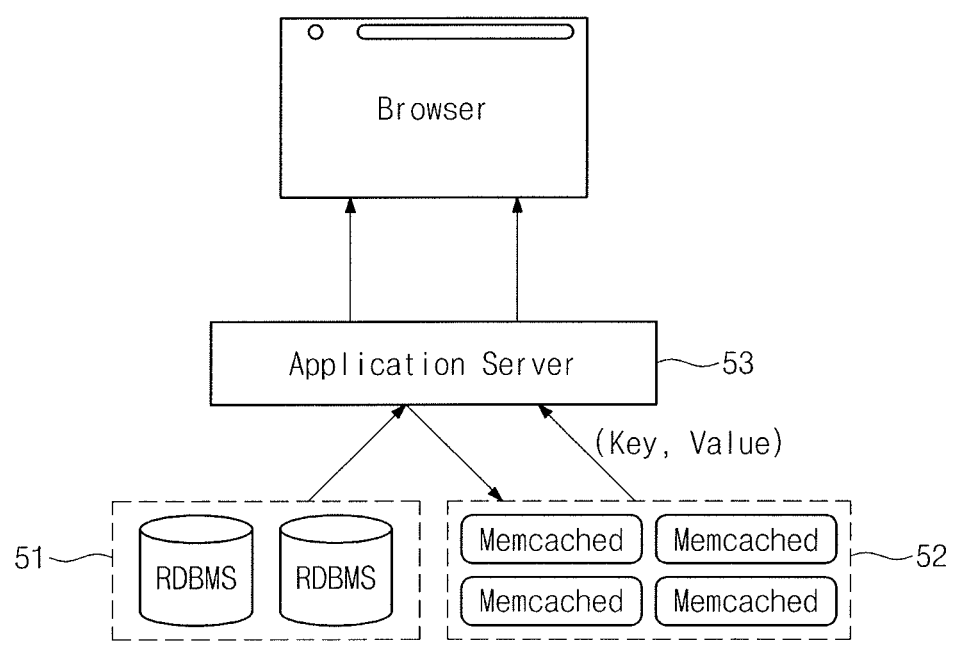
FIG. 17 illustrates an embodiment of a data server system.

FIG. 17 illustrates an embodiment of a data server system 50 which may include a related database management system (RDBMS) 51, a cache server 52, and an application server 53. The cache server 52 may maintain and delete key and value pairs, which are different from each other, based on a disable notification from the database management system 51. At least one of the related database management system 51, the cache server 52, or the application server 53 may be implemented with the host, the memory module DIMM, the nonvolatile memory module NVDIMM, the DRAM, or the nonvolatile memory as described with reference to FIGS. 1 to 16.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The controllers, processors, and other processing features of the embodiments disclosed herein may be implemented in logic which, for example, may include hardware, software, or both. When implemented at least partially in hardware, the controllers, processors, and other processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, processors, and other processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

In accordance with one or more of the aforementioned embodiments, a storage device may directly request a internal operation time for an internal operation of the storage device from a host, and the host may transfer authority on a time to the storage device during the internal operation time based on the request. Accordingly, it may be possible for the storage device to perform the internal operation sufficiently.

Example embodiments have been disclosed herein, and although specific terms are employed, they are used and are to be interpreted in a generic and descriptive sense only and not for purpose of limitation. In some instances, features, characteristics, and/or elements described in connection with a particular embodiment may be used singly or in combination with features, characteristics, and/or elements described in connection with other embodiments unless otherwise indicated. Accordingly, it will be understood that various changes in form and details may be made without departing from the spirit and scope of the embodiments set forth in the claims.

What is claimed is:

1. A nonvolatile memory module, comprising:
   at least one volatile memory;
   at least one nonvolatile memory; and
   a memory control circuit to control the at least one volatile memory and the at least one nonvolatile memory and to generate an internal operation request message for obtaining an approval of an internal operation of the at least one volatile memory or the at least one nonvolatile memory in response to detecting that an internal operation is required without any request from an external device, wherein
   the memory control circuit is to transfer the internal operation request message to the external device, receive an internal operation command responding to the internal operation request message from the external device, the internal operation command indicating whether the internal operation request message is approved or rejected, and perform the internal operation by the memory control circuit during an internal operation time when the internal operation is approved by the external device, and wherein the internal operation request message includes the internal operation time.

2. The nonvolatile memory module as claimed in claim 1, wherein the memory control circuit is to ignore a new command issued by the external device while internal operation is performed.

3. The nonvolatile memory module as claimed in claim 1, wherein the memory control circuit is to process a new command issued by the external device when the internal operation command including information corresponding to rejection of the internal operation request is received.

4. The nonvolatile memory module as claimed in claim 1, wherein the internal operation command includes the internal operation time or information corresponding to the internal operation time.

5. The nonvolatile memory module as claimed in claim 1, wherein the memory control circuit is to receive the internal operation command through at least one of at least one command pin, at least one address pin, or at least one RFU pin.

6. The nonvolatile memory module as claimed in claim 1, wherein the memory control circuit is to transfer the internal operation request message to the external device using at least one of at least one data pin or at least one data strobe pin.

7. The nonvolatile memory module as claimed in claim 1, wherein the memory control circuit is to transfer the internal operation request message to the external device using a signal toggling through at least one message pin.

8. The nonvolatile memory module as claimed in claim 1, wherein the memory control circuit is to store the internal operation time for the internal operation in a buffer area, transfer a signal corresponding to the internal operation request message to the external device through a message pin, receive a read command corresponding to the signal from the external device, read the internal operation time stored in the buffer area based on the received read command, and receive the internal operation command corresponding to the read internal operation time from the external device.

9. The nonvolatile memory module as claimed in claim 1, wherein the internal operation includes a data transmission operation between the at least one volatile memory or the at least one nonvolatile memory.

10. The nonvolatile memory module as claimed in claim 1, wherein the internal operation command includes a first internal operation command indicating an internal operation with respect to all banks or a second internal operation command indicating an internal operation with respect to a single bank.

11. An operating method of a storage device, the method comprising:
    in response to detecting that an internal operation is required without any request from an external device, sending an internal operation request for obtaining an approval of the internal operation of the storage device to the external device, the internal operation request including a message indicating internal operation time and being generated by the storage device;
    receiving an internal operation command responding to the internal operation request from the external device, the internal operation command indicating whether the internal operation request is approved or rejected; and
    performing the internal operation by the storage device during the internal operation time approved through the internal operation command when the internal operation requested is approved by the external device.

12. The method as claimed in claim 11, wherein the method further includes sending a message ready signal to the external device, and receiving a message read command to the storage device before sending the internal operation request.

13. The method as claimed in claim 11, wherein the internal operation time indicates an amount of time required to perform the internal operation.

14. The method as claimed in claim 11, wherein requesting the internal operation time includes:
    storing the internal operation time in a buffer area of the storage device; and
    transferring the request to the external device using a message channel, wherein the method includes reading the internal operation time stored in the buffer area and performing the internal operation for the read internal operation time when the internal operation command is received.

15. The method as claimed in claim 11, wherein receiving the internal operation command includes receiving the internal operation command through at least one of at least one command pin, at least one address pin, or at least one reserved future use (RFU) pin.

16. The method as claimed in claim 11, wherein performing the internal operation includes performing the internal operation with respect to all or some banks based on the internal operation command.

17. The method as claimed in claim 11, wherein:
the internal operation command includes information indicating approval or rejection with respect to the request, and
the method includes ignoring a new command issued from the external device when the internal operation command includes the information indicating the approval with respect to the request.

18. The method as claimed in claim 11, wherein:
the internal operation command includes information indicating approval or rejection with respect to the request, and
the method includes processing a new command issued from the external device when the internal operation command includes the information indicating the rejection with respect to the request.

19. The method as claimed in claim 11, wherein the internal operation includes at least one of a refresh operation, a timing calibration operation, or an internal data transmission operation.

20. The method as claimed in claim 11, wherein the storage device includes one of a dual in-line memory module (DIMM), a nonvolatile dual in-line memory module (NVDIMM), a solid state drive (SSD), universal flash storage (UFS), an embedded multimedia card (eMMC), a secure digital (SD) card, a dynamic random access memory (DRAM), a static RAM (SRAM), a NAND flash memory, a vertical NAND flash memory, a phase RAM (PRAM), or a resistive RAM (RRAM).

* * * * *